United States Patent
Rostoker

(10) Patent No.: US 9,229,639 B2
(45) Date of Patent: Jan. 5, 2016

(54) METHOD AND NON-VOLATILE MEMORY DEVICE FOR IMPROVING LATENCY TOGETHER WITH WRITE PROTECTION

(71) Applicant: SANDISK TECHNOLOGIES INC., Plano, TX (US)

(72) Inventor: Tal Rostoker, Kfar Vradim (IL)

(73) Assignee: SANDISK TECHNOLOGIES INC., Plano, TX (US)

(*) Notice: Subject to any disclaimer, the term of this patent is extended or adjusted under 35 U.S.C. 154(b) by 0 days.

(21) Appl. No.: 13/793,209

(22) Filed: Mar. 11, 2013

(65) Prior Publication Data

US 2014/0258592 A1    Sep. 11, 2014

(51) Int. Cl.
| | |
|---|---|
| G06F 12/00 | (2006.01) |
| G06F 3/06 | (2006.01) |
| G06F 12/02 | (2006.01) |
| G06F 12/14 | (2006.01) |
| G11C 16/22 | (2006.01) |
| G11C 8/20 | (2006.01) |

(52) U.S. Cl.
CPC ............ *G06F 3/0611* (2013.01); *G06F 3/0679* (2013.01); *G06F 12/0246* (2013.01); *G06F 12/1416* (2013.01); *G06F 12/1425* (2013.01); *G06F 12/1441* (2013.01); *G11C 16/22* (2013.01); *G06F 2212/1052* (2013.01); *G06F 2212/2022* (2013.01); *G06F 2212/7207* (2013.01); *G11C 8/20* (2013.01)

(58) Field of Classification Search
CPC .............................. G06F 12/1416; G06F 12/14
USPC .................................................. 711/156, 163
See application file for complete search history.

(56) References Cited

U.S. PATENT DOCUMENTS

| | | | |
|---|---|---|---|
| 6,285,583 B1 | 9/2001 | Cleveland et al. | |
| 7,068,545 B1 * | 6/2006 | Kimelman et al. | 365/189.16 |

(Continued)

OTHER PUBLICATIONS

JEDEC Standard No. JESD84-A441, Embedded MultiMediaCard(e•MMC) e•MMC/Card Product Standard, High Capacity, including Reliable Write, Boot, Sleep Modes, Dual Data Rate, Multiple Partitions Supports, Security Enhancement, Background Operation and High Priority Interrupt (MMCA, 4.41), JEDEC Solid State Technology Association, Mar. 2010, 234 pages.

(Continued)

*Primary Examiner* — Gurtej Bansal
(74) *Attorney, Agent, or Firm* — Toler Law Group, PC

(57) ABSTRACT

A data storage device includes a write protection data structure that includes a first set of entries corresponding to a first set of ranges of memory addresses. A first indication stored in an entry, in the first set of entries, corresponds to an absence of write-protected data between a lowest address of the range of addresses corresponding to the entry and a highest address of a memory. A second indication stored in the entry corresponds to write-protected data within the range of addresses. The data storage device also includes a write protection map that includes a second set of entries corresponding to a second set of ranges of the memory addresses. The device is configured to locate, in the write protection data structure, an entry corresponding to a range of memory addresses.

25 Claims, 3 Drawing Sheets

(56) References Cited

U.S. PATENT DOCUMENTS

| | | | |
|---|---|---|---|
| 7,287,140 B1* | 10/2007 | Asanovic et al. | 711/163 |
| 7,640,404 B2* | 12/2009 | Macintyre et al. | 711/154 |
| 8,392,683 B1* | 3/2013 | Confalonieri | 711/163 |
| 2004/0268084 A1 | 12/2004 | Longerbeam et al. | |
| 2008/0077749 A1* | 3/2008 | Cohen | 711/152 |
| 2008/0250509 A1 | 10/2008 | Ahvenainen | |
| 2009/0113141 A1* | 4/2009 | Bullman et al. | 711/147 |
| 2009/0172243 A1* | 7/2009 | Champagne et al. | 711/3 |
| 2009/0248756 A1* | 10/2009 | Akidau et al. | 707/203 |
| 2010/0017650 A1* | 1/2010 | Chin et al. | 714/6 |
| 2010/0162038 A1 | 6/2010 | Hulbert et al. | |
| 2011/0141792 A1 | 6/2011 | Ozatay et al. | |
| 2011/0231597 A1* | 9/2011 | Lai et al. | 711/103 |
| 2012/0215989 A1* | 8/2012 | Moyer et al. | 711/145 |
| 2013/0290635 A1* | 10/2013 | Craske et al. | 711/118 |

OTHER PUBLICATIONS

Non-Final Office Action mailed May 30, 2014 in U.S. Appl. No. 14/246,479, 23 pages.

International Search Report and Written Opinion of the International Searching Authority (EPO) for International Application No. PCT/US2014/022583, mailed Sep. 2, 2014, 12 pages.

Volpe, Francesco P. et al. "More Data Security for Serial EEPROMs: Page Protection Mode Ensures Integrity," Siemens AG, Munchen, DE, Components, vol. 31, No. 5, 1996, pp. 18-21.

Final Office Action mailed Nov. 19, 2014 in U.S. Appl. No. 14/246,479, 17 pages.

Notice of Allowance and Fee(s) Due mailed May 6, 2015 in U.S. Appl. No. 14/246,479, 5 pages.

* cited by examiner

METHOD AND NON-VOLATILE MEMORY DEVICE FOR IMPROVING LATENCY TOGETHER WITH WRITE PROTECTION

FIELD OF THE DISCLOSURE

The present disclosure is generally related to write protection in memory devices.

BACKGROUND

Non-volatile data storage devices, such as universal serial bus (USB) flash memory devices or removable storage cards, have allowed for increased portability of data and software applications. Such devices may enable data to be stored by a host device and later retrieved from a memory in the data storage device. For example, a host device may send a write command to a data storage device and specify a memory address. The data storage device may store data to a memory location indicated by the memory address.

When a write command is received from a host device, the data storage device may be responsible for ensuring that write-protected data stored in the memory is not overwritten by the host device. The data storage device may maintain a write protection map that identifies whether write protection is enabled for each memory address that maps to a location in the memory. For example, a write protection map may have a write protection indicator for each group of memory addresses, such as sector-sized groups (e.g., 512 bytes), page-sized groups (e.g., 2 kilobytes), or other-sized groups of memory addresses. Starting at the address provided by the host device, the data storage device may "walk" through the write protection map, in response to receiving a write command, to identify a total amount of sequentially addressed space that is not write-protected to determine a largest amount of data that may be stored in response to the write command.

However, because memory capacity increases with advances in storage technologies, a size of the write protection map may also increase. An amount of time expended walking through the write protection map creates write latency experienced by the host device. For example, when a first address following the write address is write protected, the write protection map search may be completed in a few microseconds. However, when the write address is near a beginning of an address space and a first address of write protected data is near an end of the address space, the write protection map search may take tens of microseconds to complete.

SUMMARY

A data storage device includes a write protection data structure that includes a first set of entries corresponding to a first set of ranges of memory addresses. Each entry includes a memory address of write-protected data, a first indication, or a second indication. The first indication corresponds to an absence of write-protected data between a lowest address of the range of addresses and a highest address of a memory. The second indication corresponds to write-protected data within the range of addresses. Write protection information may be retrieved by accessing the write protection data structure and may reduce or eliminate latency associated with searching a write protection map.

DETAILED DESCRIPTION

Figure 1:
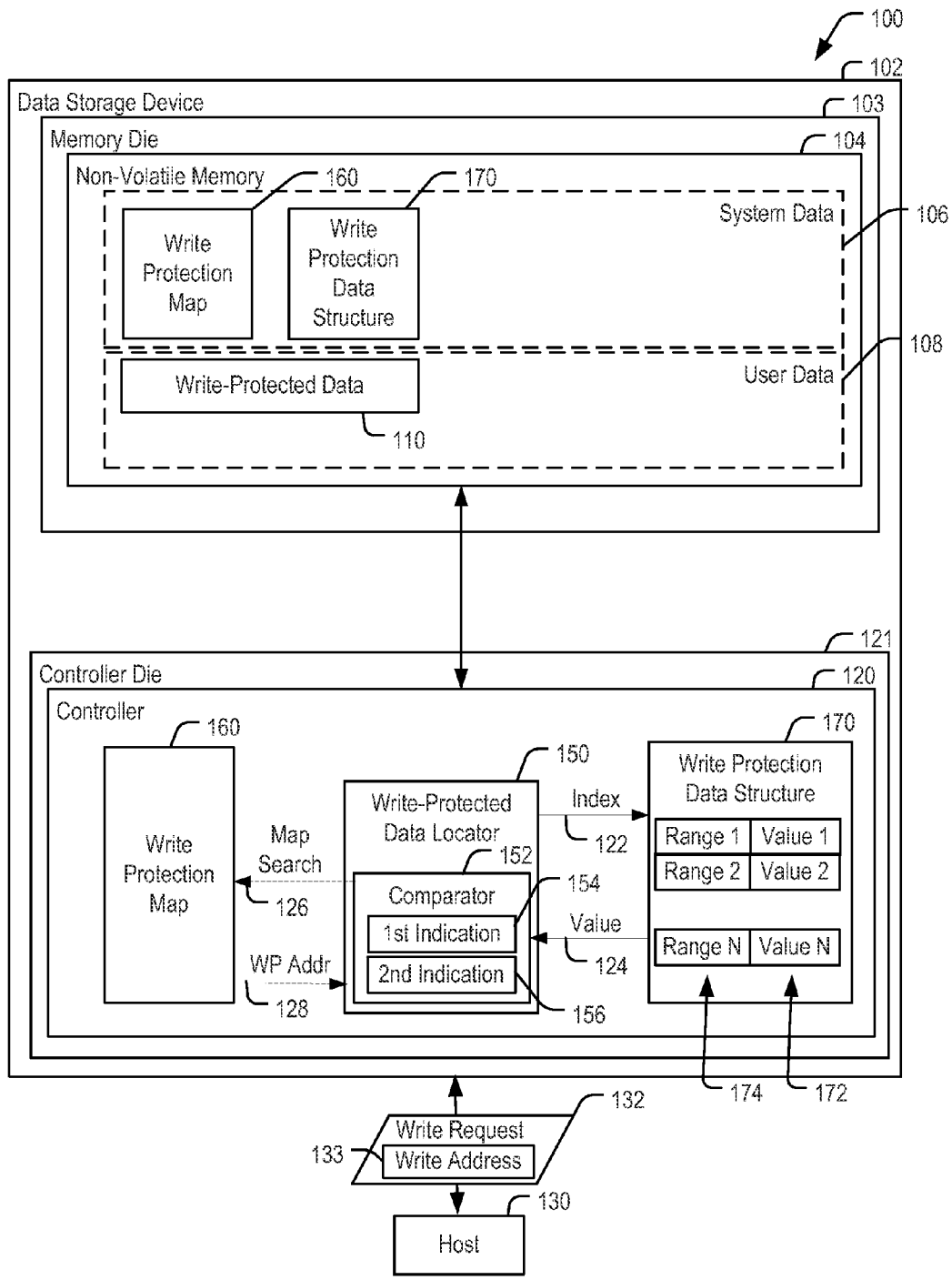
FIG. 1 is a block diagram of a particular illustrative embodiment of a system including a data storage device configured to access a write protection data structure to locate non-protected areas of a memory.

Referring to FIG. 1, a particular embodiment of a system 100 includes a data storage device 102 coupled to a host device 130. The data storage device 102 is configured to maintain a write protection data structure 170 that enables faster access to identify non-protected areas of a memory 104, as compared to searching a write protection map 160.

The host device 130 may be configured to provide data, such as the user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 includes the memory 104 on a memory die 103 that is coupled to a controller 120 on a controller die 121. The memory 104 is a non-volatile memory, such as a NAND flash memory. The memory 104 may include groups of storage elements, such as a word line of a multi-level cell (MLC) flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a system data portion 106 and a user data portion 108. The system data portion 106 may include one or more sets of data that may be used by the controller 120 or the host device 130 to store information. For example, the system data portion 106 may include file and directory information, such as file management tables for a file system that may be used by the host device 130 and/or by the controller 120. The system data portion 106 includes a write protection map 160 and a write protection data structure 170. The user data portion 108 is configured to store user data, such as in response to requests for write access from the host device 130. Portions of the user data portion 108 may be configured to be write protected or non-write protected. For example, the user data portion 108 may store write-protected data 110. The write protected data 110 may correspond to data that has been stored in the memory 104 and that is not permitted to be overwritten or erased. The write protection map 160 includes a mapping of addresses to data stored in the memory 104 and an indication of whether or not addresses (or ranges of addresses) correspond to write protected regions or non-write protected regions of the memory 104.

The controller 120 is configured to receive data and instructions from and to send data to the host device 130 while the data storage device 102 is operatively coupled to the host device 130. For example, the controller 120 is configured to send data and a write command to instruct the memory 104 to store the data to a memory location that is identified by a specified address. As another example, the controller 120 is configured to send a read command to read data from a memory location that is identified by a specified address.

The controller 120 includes a write-protected data locator 150, a copy of the write protection map 160, and a copy of the write protection data structure 170. For example, the write protection map 160 may be read from the system data portion 106 of the memory 104 upon initialization of the controller 120 and stored in controller memory (e.g., a random access memory (RAM) embedded within or coupled to the controller die 121). The write protection data structure 170 may be read from the memory 104 upon initialization of the controller 120 and stored into a controller memory. However, in other implementations, the write protection data structure 170 may not be stored in the memory 104 and may instead be generated by the controller 120 and populated based on information in the write protection map 160.

The write protection data structure 170 includes a set of entries 172 corresponding to a set of ranges 174 of memory addresses. Each entry of the set of entries 172 includes a value, illustrated as a first value in a first entry, a second value in a second entry, to an Nth value in an Nth entry. Each value may correspond to a first indication, a second indication, or a memory address. As explained in further detail with respect to FIG. 2, the first indication may correspond to an absence of write protected data between the lowest address of a range of addresses corresponding to the entry and the highest address of the memory 104. As used herein, comparisons between memory addresses are described with respect to numerical values of the addresses, so that an address with a larger numerical value is "greater" or "higher" than an address with a smaller numerical value. The second indication may correspond to write protected data being within the range of addresses corresponding to the entry. A memory address stored in an entry indicates an address of write protected data that is stored in the memory 104.

The write protection data structure 170 may be formed according to a table format and may be indexed by the write protected data locator 150 using an index 122. For example, the index 122 may be formed according to a set of most significant bits of the write address 133. To illustrate, when each of the ranges of the set of ranges 174 corresponds to a one gigabyte range, a low order (i.e., least significant) 30 bits of the write address 133 may be ignored, and higher order bits (e.g., the 3 most significant bits of a 33-bit address corresponding to an 8 gigabyte address range) of the write address 133 may be used to form the index 122 to select a particular entry of the write protection data structure 170. In response to providing the index 122 to the write protection data structure 170, a corresponding value 124 may be read from the indexed entry and received at the write protected data locator 150. The value 124 may include a first indication 154, a second indication 156, or a memory address.

The write protected data locator 150 may be configured to receive the value 124 from the write protection data structure 170 and to perform one or more comparisons at a comparator 152. To illustrate, the comparator 152 may compare the value 124 to the first indication 154 to determine whether the value 124 matches the first indication 154. The comparator 152 may be configured to compare the value 124 to the second indication 156 to determine whether the value 124 matches the second indication 156. The indications 154, 156 may be bit patterns that may be stored at the controller 120, such as in a read-only memory. In response to the value 124 matching the first indication 154, the write protected data locator 150 may determine that no write protected data exists between the address specified in the write address 133 and a highest address of the memory 104. In response to the comparator 152 determining that the value 124 matches the second indication 156, the write protected data locator 150 may determine that write protected data exists within the range of addresses corresponding to the index 122. In response to the value 124 not matching the first indication 154 and also not matching the second indication 156, the write protected data locator 150 may determine that the value 124 corresponds to a memory address of write-protected data in the memory 104 that has a lowest address (that is greater than the write address 133) of any other write-protected data in the memory 104.

When the value 124 matches the first indication 154 or is a memory address, the write protected data locator 150 does not search the write protection map 160. However, in response to determining that the value 124 matches the second indication 156, the write protected data locator 150 may be configured to initiate a map search 126 of the write protection map 160. To illustrate, upon determining that the value 124 matches the second indication 156, the write protected data locator 150 may be configured to search the write protection map 160 in a range from the write address 133 to a highest address within the range corresponding to the index 122 because at least one memory address within the range corresponds to write protected data. The map search 126 may be performed by the write protected data locator 150 reading a data value from a map entry of the write protection map 160 that corresponds to a group of addresses that includes the write address 133. The write protected data locator 150 may compare the value read from the write protection map 160 to a write protected indicator to determine whether the map entry includes an indication of write protection. In response to determining that the map entry does not store the indication of write protection for the write address 133, the write protected data locator 150 may increment an index into the write protection map 160 to identify a next sequential entry corresponding to a next sequential range of addresses in the write protection map 160 and may determine whether the identified entry includes an indication of write protection. In this manner, the write protected data locator 150 may repeatedly increment an index to the write protection map 160 and evaluate a value stored at an entry corresponding to the incremented index until an indication of write protection is determined. Upon determination of the indication of write protection, a memory address 128 corresponding to the entry indicating write protection may be returned by the write protection map 160 or otherwise identified by the write protected data locator 150.

During operation, the controller 120 may receive the write request 132 from the host device 130 as a request for write access to the memory 104. The write request 132 may include the write address 133 or may otherwise provide an indication to enable the controller 120 to determine the write address 133 (e.g., by incrementing a previously received write address). In response to determining that the received request is a request for write access and determining the write address 133, the controller 120 may be configured to determine a range of non-protected memory addresses by locating a next address following the write address 133 that is non-writable, such as due to storing write protected data or due to being a highest address of the memory 104. The write protected data locator 150 may generate the index 122 from a set of most significant bits of the write address 133 and may provide the index 122 to the write protection data structure 170. In response to reading the write protection data structure 170 using the index 122, the write protected data locator 150 receives the value 124 corresponding to the index 122 and may perform one or more comparisons at the comparator 152.

The write protected data locator 150 may compare the first indication 154 to the value 124 to determine whether the value 124 matches the first indication 154. For example, the comparator 152 may be configured to compare bits of the value 124 to stored bits of the first indication 154. As another example, the first indication 154 may correspond to an all-zeroes value, and the comparator 152 may be configured to perform a bitwise OR operation on the value 124 to compare the value to the first indication 154. The write protected data locator 150 may compare the second indication 156 to the value 124 to determine whether the value 124 matches the second indication 156. For example, the comparator 152 may be configured to compare bits of the value 124 to stored bits of the second indication 156. As another example, the second indication 156 may be an all-ones value, and the comparator 152 may be configured to perform a bitwise AND operation on the value 124 to compare the value 124 to the second indication 156. In response to determining that the value 124 matches the first indication 154, the write protected data locator 150 may determine that no write protected data regions exist in the memory 104 with an address higher than the write address 133. In response to determining that the value 124 does not match the first indication 154 and does not match the second indication 156, the write protected data locator 150 may generate an indication that the value 124 is a memory address of a closest memory address that is greater than the write address 133 and that stores write protected data.

However, when the value 124 is determined to match the second indication 156, the write protected data locator 150 may initiate the map search 126 to sequentially search consecutive entries of the write protection map 160, starting with the entry corresponding to the write address 133, to identify a first entry in the write protection map 160 that corresponds to an address larger than the write address 133 and that indicates write-protected data. The map search 126 may determine the write protection memory address 128 that represents a first non-writable memory address that is larger than the write address 133 and that may limit the amount of data that may be written in response to the write request 132.

By first accessing the write protection data structure 170 and determining whether the value 124 indicates the first indication 154 or an address, in certain scenarios, the map search 126 may be avoided. For example, the write protection data structure 170 may include a relatively small number of entries 172 as compared to a number of map entries in the write protection map 160. To illustrate, the write protection data structure 170 may have eight entries, such as described with respect to FIG. 2, while the write protection map 160 may include thousands of entries. As a result, a latency of writing data corresponding to the write request 132 may be reduced by reducing or eliminating a search of the write protection map 160 that would otherwise be performed to determine an upper boundary of memory addresses that are accessible for writing data beginning with the write address 133, such as described in further detail with respect to FIG. 2.

Figure 2:
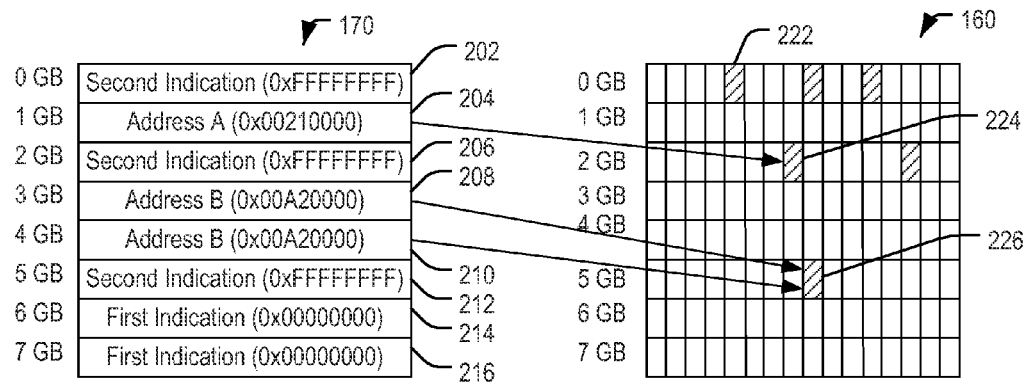
FIG. 2 is a block diagram illustrating a particular embodiment of components that may be incorporated in the data storage device of FIG. 1.

Referring to FIG. 2, further detail of a particular embodiment of the write protection data structure 170 and the write protection map 160 is shown. The write protection data structure 170 is illustrated as including eight entries 202-216 for an 8 gigabyte implementation of the memory 104, with each of the entries 202-216 corresponding to a 1 gigabyte range of addresses. For example, the first entry 202 corresponds to a 1 gigabyte range of addresses beginning with memory address 0, and the second entry 204 corresponds to a next consecutive 1 gigabyte range of addresses. As illustrated, the first entry 202 corresponds to a range of addresses matching the first row of the write protection map 160. The first row of the write protection map 160 includes three entries, such as a map entry 222, that correspond to write protection regions and that are illustrated as hatched entries. The first row of the write protection map 160 also includes multiple other entries that correspond to non-write protection regions and that are illustrated as non-hatched entries. The first entry 202 of the write protection data structure 170 stores the second indication 156 which may be set to an all-ones value ("0xFFFFFFFF" in hexadecimal notation). The first entry 202 includes the second indication 156 because one or more write protection regions are identified within the corresponding range of addresses of the write protection map 160 (e.g., within a 1 gigabyte range of addresses starting at address 0).

The second entry 204 of the protection data structure 170 corresponds to a range of addresses that, as illustrated in the write protection map 160, do not include any write protected data (i.e., no hatched entries are in the second row of the write protection map 160). However, the write protection map 160 illustrates that one or more additional write protected data areas exist at memory addresses higher than the second range corresponding to the second entry 204. For example, a next write protected region occurs at an address range corresponding to a map entry 224. As a result, the second entry 204 includes an address "A" having a value corresponding to an address of the write protected data area indicated by the map entry 224, illustrated as "0x00210000".

The third entry 206 of the write protection data structure 170 corresponds to a range of memory addresses that includes one or more write protected regions (e.g., corresponding to the map entry 224), and therefore the third entry 206 stores the second indication 156.

The fourth entry 208 of the write protection data structure 170 corresponds to a range of addresses that does not include memory addresses of write protected data. A next lowest memory address of write protected data occurs at an address corresponding to a region indicated by a map entry 226 of the write protection map 160. As a result, the fourth entry 208 of the write protection data structure 170 stores an address "B" (illustrated as "0x00A20000") of the write protected data corresponding to the map entry 226. The fifth entry 210 of the write protection data structure 170 also corresponds to a range of memory addresses that do not correspond to write protected data. Therefore, the value stored in the fifth entry 210 of the write protection data structure 170 also corresponds to the next lowest address of write protected data, address B.

The sixth entry 212 of the write protection data structure 170 corresponds to a range of memory addresses that includes address B. As a result, the sixth entry 212 includes the second indication 156 (e.g., the all-ones value). The seventh entry 214 and the eighth entry 216 of the write protection data structure 170 each map to a respective range of addresses that do not correspond to write protected data. Further, no write protected data exists in addresses between the range of addresses of the seventh and eighth entries 214, 216 and the highest address of the memory 104. As a result, the seventh entry 214 and the eighth entry 216 each stores the first indication 154 (e.g., the all-zeroes value).

The controller 120 of FIG. 1 may be configured to generate the write protection data structure 170 upon initialization by accessing the write protection map 160 and by walking sequentially through entries of the write protection map 160 to determine whether write protected data is stored at memory addresses corresponding to each of the entries 202-216 of the write protection data structure 170. As a result, the controller 120 may traverse the entire write protection map 160 a single time upon initialization to generate the write protection data structure 170. After generating the write protection data structure 170, the controller 120 may be configured to determine an address of write protected data either by performing a single access to the write protection data structure 170 or by performing the single access to the write protection data structure 170 and performing an abbreviated search of the write protection map 160. The abbreviated search may be constrained to be within an address range that corresponds to an address range of the entry that is read from the write protection data structure 170.

For example, if the write address 133 of FIG. 1 corresponds to a first address in the range of memory addresses corresponding to the third entry 206 (e.g., the memory address from 2 GB to 3 GB), the value 124 returned to the write protected data locator 150 may be the second indication 156 (as in FIG. 2). The write protected data locator 150 may determine, by accessing the write protection data structure 170, that one or more write protected data addresses exist within the 1 gigabyte range of addresses corresponding to the third entry 206. Thus, the write protected data locator 150 may initiate a map search to sequentially access each of the map entries beginning with the write address 133 and continuing along the third row (as illustrated in FIG. 2) of the write protection map 160 to find an address of write protected data, illustrated as the map entry 224 of the write protection map 160. The search of the write protection map 160 ends when an address of write protected data is found. If the search of the write protection map 160 reaches the largest memory address corresponding to the third entry 206 without locating an address of write protected data, then the next entry 208 of the write protection data structure 170 is accessed to identify a next address of write protected data (address B). Therefore, a longest search of the write protection map 160 that may be conducted by the write protected data locator 150 in response to a write request is a search of entries corresponding to address regions that, when combined, span a range of memory addresses corresponding to two entries of the write protection data structure 170.

The controller 120 of FIG. 1 may further be configured to update the entries of the write protection data structure 170 in response to a command from the host device 130. For example, in response to the host device 130 instructing the controller 120 to set a particular memory address as a write protected memory address, the controller 120 may update the write protection map 160 to indicate the change in write protection for the particular memory address and may further update one or more of the entries of the write protection data structure 170 based on the change in write protection.

Figure 3:
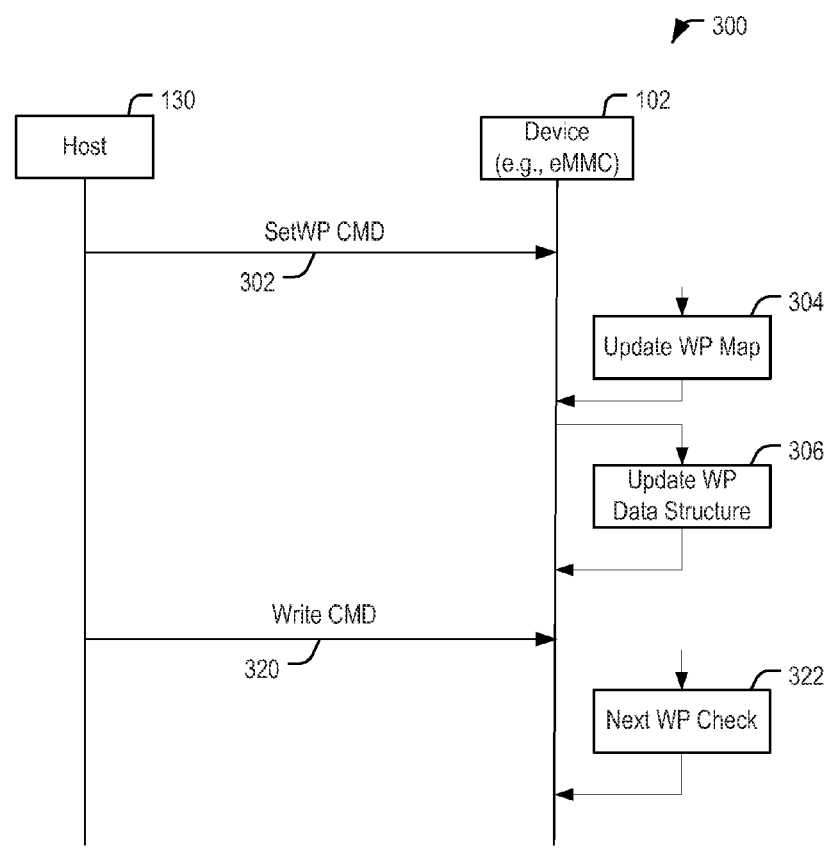
FIG. 3 is a general diagram that illustrates operations that may be performed by the data storage device of FIG. 1.

FIG. 3 illustrates an example 300 of operations that may be performed at the host device 130 and operations that may be performed at the data storage device 102 of FIG. 1. For example, the data storage device 102 may correspond to an eMMC (embedded MultiMedia Card) device and may operate in compliance with a Joint Electron Devices Engineering Council (JEDEC) industry specification, such as an eMMC specification or a Universal Flash Storage (UFS) specification. The host device 130 may send a set write protection (SetWP) command 302 to the data storage device 102 while the host device 130 is operatively coupled to the data storage device 102. For example, the SetWP command 302 may correspond to a set write protection command or a clear write protection command. The Set WP command 302 may indicate whether write protection is to be set or to be cleared and may indicate a memory address, or a range of memory addresses, to which the write protection is to be applied. The data storage device 102 may receive the set write protection command 302 and in response may perform a map update operation 304 to update the write protection map 160. Updating the write protection map 160 may include locating a map entry in the write protection map 160 corresponding to the memory address indicated by the set write protection command 302 and modifying a value in the located map entry. After updating the write protection map, the data storage device 102 may perform an update write protection data structure operation 306. The update write protection data structure operation 306 may include modifying one or more entries of the write protection data structure 170 to indicate whether the designated write address or range of write addresses correspond to write protected data.

The host device 130 may further be configured to send a write command 320, such as the request for write access 132 of FIG. 1, to the data storage device 102 while the host device 130 is operatively coupled to the data storage device 102. In response to receiving the write command 320, the data storage device 102 may perform a next write protection check operation 322. For example, the next write protection check operation 322 may include accessing the write protection data structure 170 and receiving the returned value 124. In response to the returned value 124 matching the first indication 154, the next write protection check operation 322 may return a value indicating that no write protected data is stored at addresses higher than the write address. In response to the returned value 124 matching a memory address, the next write protection check operation 322 may return the memory address. In response to the returned value 124 matching the second indication 156, the next write protection check operation 322 may include performing the abbreviated map search 126 to identify a next write protection address. The next write protection check operation 322 may return the identified next write protection address.

Figure 4:
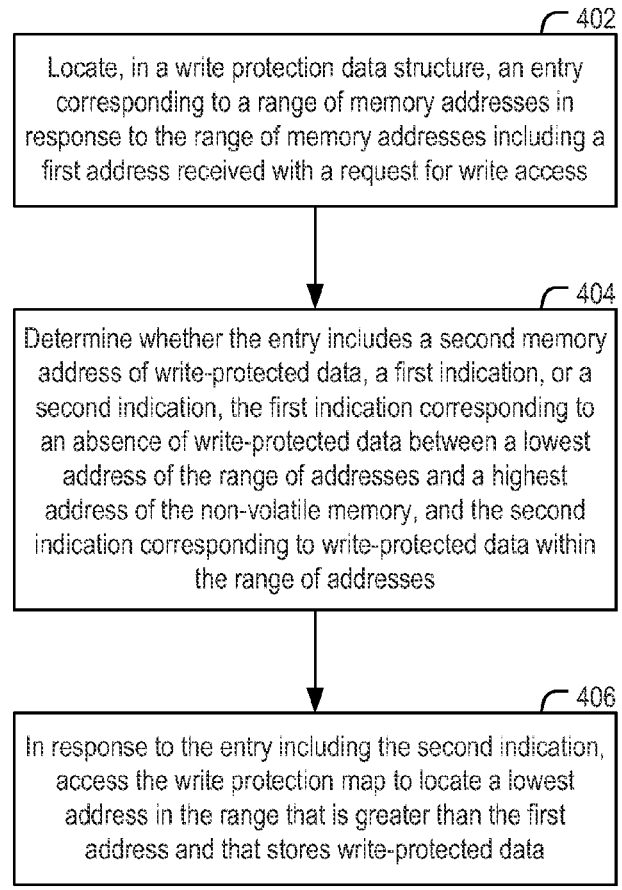
FIG. 4 is a flow chart of a particular illustrative embodiment of a method of locating non-protected areas of a memory.

Referring to FIG. 4, a particular embodiment of a method 400 is depicted. The method 400 may be performed in a data storage device, such as the data storage device 102 of FIG. 1, that includes a controller and a non-volatile memory and that contains a write protection data structure and a write protection map that are accessible to the controller. The method 400 may be performed in response to receiving a request for write access to the non-volatile memory. The request (e.g., the write request 132 of FIG. 1) may be received from a host device while the data storage device is operatively coupled to the host device.

The method 400 includes locating, in the write protection data structure, an entry corresponding to a range of memory addresses in response to the range of memory addresses including a first address received with the request, at 402. For example, the write protection data structure 170 may include a table of entries, and locating the entry in the write protection data structure may include using a set of most significant bits of the first address as an index to the table. The entry may correspond to the index, such as the index 122 of FIG. 1 that corresponds to a set of most significant bits of the write address 133.

A determination is made whether the entry includes a second memory address of write-protected data, a first indication, or a second indication, at 404. The first indication, such as the first indication 154, corresponds to an absence of write-protected data between a lowest address of the range of addresses and a highest address of the non-volatile memory. The second indication, such as the second indication 156, corresponds to an indication that write-protected data is within the range of addresses.

In response to the entry including the second indication, the write protection map is accessed to locate a lowest address in the range that is greater than the first address and that stores write-protected data, at 406. For example, accessing the write protection map to locate the lowest address in the range that is greater than the first address and that stores write-protected data may correspond to the abbreviated search 126 of FIG. 1 and may include accessing a first map entry (corresponding to the first address) of the write protection map 160 of FIG. 1 and reading the first map entry to determine whether the first map entry includes a write-protection indicator. In response to the first map entry not including the write-protection indicator, one or more other map entries may be accessed according to sequential order of the one or more other map entries until an accessed map entry includes the write-protection indicator (e.g., map entry 224) or corresponds to a highest address of the range of addresses.

Determining whether the entry includes the second memory address, the first indication, or the second indication enables the controller to determine, without the controller accessing the write protection map, a highest address of writable memory that may be accessed via the request in response to the entry including the second memory address or the first indication. For example, determining whether the entry includes the second memory address of write-protected data, the first indication, or the second indication may include reading a value, such as the value 124 of FIG. 1 that corresponds to the entry. The value may be compared to the first indication to determine whether the value matches the first indication and may be compared to the second indication to determine whether the value matches the second indication. In response to the value not matching the first indication and not matching the second indication, a determination may be made that the entry includes the second address. For example, the first indication may be an all-zeros value and a bitwise OR operation may be performed on the value to compare the value to the first indication, and the second indication may be an all-ones value and a bitwise AND operation may be performed on the value to compare the value to the second indication.

Because each entry in the write protection data structure may correspond to a larger range of memory addresses than each map entry in the write protection map, a fewer number of accesses may be performed to determine a non-protected area of memory by locating a nearest write-protected region of memory in the write protection data structure. As described with respect to FIGS. 1 and 2, when an entry includes the first indication 154 or an address, accessing the write protection map 160 (and the latency of performing a search of the write protection map 160) may be avoided. Otherwise, when an entry includes the second indication 156, the map search 126 may be performed over a subset of the write protection map 160. As described with respect to FIG. 2, the map search 126 may terminate upon reaching an end of an address range corresponding to the entry, which may result in reduced latency as compared to continuing the search until a next write protection address, or an end of memory addresses, is reached.

Although various components depicted herein are illustrated as block components and described in general terms, such components may include one or more microprocessors, state machines, or other circuits configured to enable the write-protected data locator 150 of FIG. 1 to access the write protection data structure 170 to locate an address of write-protected data. For example, the write-protected data locator 150 may represent physical components, such as hardware controllers, state machines, logic circuits, or other structures, to enable the write-protected data locator 150 of FIG. 1 to generate the index 122 from the write address 133, to read the value 124 corresponding to the index 122, and to selectively perform the map search 126 based on a comparison of the value 124 to the first indication 154 and/or to the second indication 156.

The write-protected data locator 150 may be implemented using a microprocessor or microcontroller programmed to generate the index 122 from the write address 133, read the value 124 corresponding to the index 122, compare the value 124 to the first indication 154 and/or to the second indication 156, and selectively perform the map search 126 in response to the value 124 matching the second indication 156. In a particular embodiment, the write-protected data locator 150 includes a processor executing instructions that are stored at the memory 104. Alternatively, or in addition, executable instructions that are executed by the processor may be stored at a separate memory location that is not part of the memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a controller and a non-volatile memory, the data storage device containing a write protection data structure and a write protection map that are accessible to the controller, determining whether to perform a map search of the write protection map in response to receiving from a host device a request for write access to the non-volatile memory by:
   locating, in the write protection data structure, an entry corresponding to a range of memory addresses; and
   determining whether the entry that is located includes a first indication or a second indication, the first indication corresponding to an absence of a write-protected area within the range of memory addresses of the non-volatile memory and the second indication corresponding to a write-protected area within the range of memory addresses.

2. The method of claim 1, wherein the determining whether to perform the map search includes determining that the map search is avoidable to reduce latency if the entry includes the first indication.

3. The method of claim 1, wherein the map search is performed to find a range of non-protected addresses corresponding to storage sufficient for containing data requested to be written by the host device.

4. The method of claim 1, wherein the data storage device operates in compliance with a Universal Flash Storage (UFS) specification.

5. The method of claim 1, wherein the data storage device operates in compliance with an eMMC specification.

6. The method of claim 1, wherein the controller determines, in response to the entry including a memory address or including the first indication and without the controller accessing the write protection map, a highest address of writable memory that is accessible in response to the request for write access, and wherein the entry including the second indication indicates the map search is to be performed.

7. The method of claim 1, wherein each entry in the write protection data structure corresponds to a larger range of memory addresses than each map entry in the write protection map.

8. The method of claim 1, wherein the determining whether to perform the map search further includes determining whether the entry that is located includes an address.

9. The method of claim 8, wherein the determining whether to perform the map search includes determining that the map search is avoidable to reduce latency if the entry includes the first indication or if the entry includes the address.

10. The method of claim 1, wherein the write protection data structure includes a table of entries, wherein locating the entry in the write protection data structure includes using a set of most significant bits of a first address received with the request as an index to the table.

11. The method of claim 10, wherein determining whether the entry includes the first indication or the second indication includes:
   reading a value from the table, the value corresponding to the entry;
   comparing the value to the first indication to determine whether the entry includes the first indication;
   comparing the value to the second indication to determine whether the entry includes the second indication; and
   in response to the value not matching the first indication and not matching the second indication, determining that the entry includes an address of the write-protected area.

12. The method of claim 11, wherein performing the map search includes accessing the write protection map to locate the lowest address in the range that is greater than a first address received with the request and that corresponds to the write-protected area by:
   accessing a first map entry of the write protection map, the first map entry corresponding to the first address;
   reading the first map entry to determine whether the first map entry includes a write-protection indicator; and
   in response to the first map entry not including the write-protection indicator, accessing one or more other map entries according to a sequential order of the one or more other map entries until an accessed map entry includes the write-protection indicator or corresponds to a highest address of the range of memory addresses.

13. A data storage device comprising:
   a controller;
   a non-volatile memory coupled to the controller;
   a memory that stores a write protection data structure that includes a first set of entries corresponding to a first set of ranges of memory addresses, wherein a first indication stored in an entry in the first set of entries corresponds to an absence of a write-protected area within a first range of memory of the non-volatile memory, and wherein a second indication stored in the entry corresponds to a write-protected area within the first range of memory addresses; and
   a write protection map that includes a second set of entries corresponding to a second set of ranges of memory addresses,
   wherein the controller is configured, in response to receiving from a host device a request for write access to the non-volatile memory, to locate, in the write protection data structure, an entry corresponding to a range of memory addresses to determine whether to perform a map search of the write protection map.

14. The data storage device of claim 13, wherein the controller is configured to determine that the map search is avoidable to reduce latency in response to the entry including the first indication.

15. The data storage device of claim 13, wherein each entry in the write protection data structure corresponds to a larger range of memory addresses than each entry in the write protection map.

16. The data storage device of claim 13, wherein upon initialization of the controller, the controller is configured to populate the write protection data structure by reading the write protection map and determining whether any entry of the write protection data structure corresponds to a range of memory addresses that is indicated by the write protection map as corresponding to the write-protected area.

17. The data storage device of claim 13, wherein the controller is configured to operate in compliance with a Universal Flash Storage (UFS) specification.

18. The data storage device of claim 13, wherein the controller is configured to operate in compliance with an eMMC specification.

19. The data storage device of claim 13, wherein the controller is configured to determine whether the entry includes the first indication or the second indication by reading a value from a table of the first set of entries, the value corresponding to the entry, comparing the value to the first indication to determine whether the entry includes the first indication, comparing the value to the second indication to determine whether the entry includes the second indication, and in response to the value not matching the first indication and not matching the second indication, determining that the entry includes an address, and wherein the controller is configured to determine that the map search is avoidable to reduce latency in response to the entry including the first indication or including the address.

20. The data storage device of claim 19, wherein the first indication is an all-zeros value and the controller is configured to perform a bitwise OR operation on the value to compare the value to the first indication, wherein the second indication is an all-ones value and the controller is configured to perform a bitwise AND operation on the value to compare the value to the second indication.

21. The data storage device of claim 19, wherein the controller is configured to access the write protection map to perform the map search to locate a lowest address in the range that is greater than a first address received with the request and that corresponds to the write-protected area by accessing a first map entry of the write protection map, the first map entry corresponding to the first address, reading the first map entry to determine whether the first map entry includes a write-protection indicator, and in response to the first map entry not including the write-protection indicator, accessing one or more other map entries according to a sequential order of the one or more map other entries until an accessed map entry includes the write-protection indicator or corresponds to a highest address of the range of addresses.

22. The data storage device of claim 21, wherein the write protection data structure includes the table, and wherein the controller is configured to locate the entry in the write protection data structure using a set of most significant bits of the first address as an index to the table.

23. A method of operation in a data storage device, comprising:

in a data storage device including a controller and a non-volatile memory, wherein the data storage device contains a write protection data structure and a write protection map that are accessible to the controller, and wherein each entry of the write protection data structure corresponds to a range of addresses and contains a first indication, a second indication or a memory address of write-protected data in another range of addresses to which another entry corresponds, the first indication being that a write-protected area is missing from the range of addresses to which the entry corresponds and the second indication being that a write-protected area is present within this range of addresses, determining whether to perform a map search of the write protection map in response to receiving a request for write access to the non-volatile memory, by:

determining a first address corresponding to the request and determining whether, in the write protection data structure, there is an entry corresponding to a range of memory addresses that includes the first address;

in response to determining that there is an entry corresponding to a range of memory addresses that includes the first address, determining if this entry contains the first indication, the second indication or the memory address; and if this entry contains the first indication or the memory address of write protected data, determining whether accessing the write protection map to perform a map search can be avoided so as to reduce latency, and if this entry contains the second indication, accessing the write protection map to search for a range of non-protected addresses corresponding to storage sufficient for containing data from the request.

24. The method of claim 23, further comprising, determining whether the range of memory addresses to which this entry corresponds includes an address for write protected data which is greater than the first address, and if the range of memory addresses does not include an address for write protected data which is greater than the first address, accessing a second entry in the write protection data structure, the second entry corresponding to a second range of addresses.

25. The method of claim 23, wherein the write protection data structure includes a table of entries, wherein determining whether, in the write protection data structure, there is an entry corresponding to a range of memory addresses that includes the first address includes using a set of most significant bits of the first address as an index to the table.

* * * * *